United States Patent
Lee et al.

(10) Patent No.: US 11,567,409 B2
(45) Date of Patent: Jan. 31, 2023

(54) POLYMERS, UNDERLAYER COATING COMPOSITIONS COMPRISING THE SAME, AND PATTERNING METHODS

(71) Applicant: ROHM AND HAAS ELECTRONIC MATERIALS KOREA LTD., Cheonan-si (KR)

(72) Inventors: Jung June Lee, Hwaseong-si (KR); Suwoong Kim, Hwaseong-si (KR); Min Kyung Jang, Hwaseong-si (KR); Jin Hong Park, Hwaseong-si (KR); Jae Hwan Sim, Hwaseong-si (KR); Jae Bong Lim, Hwaseong-si (KR)

(73) Assignee: ROHM AND HAAS ELECTRONIC MATERIALS KOREA LTD., Cheonan-si (KR)

( * ) Notice: Subject to any disclaimer, the term of this patent is extended or adjusted under 35 U.S.C. 154(b) by 328 days.

(21) Appl. No.: 16/851,806

(22) Filed: Apr. 17, 2020

(65) Prior Publication Data

US 2021/0324122 A1   Oct. 21, 2021

(51) Int. Cl.
| | |
|---|---|
| G03F 7/11 | (2006.01) |
| C08F 220/32 | (2006.01) |
| G03F 7/09 | (2006.01) |
| C08F 220/36 | (2006.01) |
| C08F 220/30 | (2006.01) |
| G03F 7/16 | (2006.01) |
| G03F 7/20 | (2006.01) |
| G03F 7/039 | (2006.01) |
| G03F 7/004 | (2006.01) |

(52) U.S. Cl.
CPC ............ *G03F 7/11* (2013.01); *C08F 220/301* (2020.02); *C08F 220/325* (2020.02); *C08F 220/365* (2020.02); *G03F 7/0045* (2013.01); *G03F 7/0397* (2013.01); *G03F 7/09* (2013.01); *G03F 7/168* (2013.01); *G03F 7/20* (2013.01); *G03F 7/2012* (2013.01); *G03F 7/094* (2013.01)

(58) Field of Classification Search
CPC ........ G03F 7/11; C08F 220/34; C08F 220/36; C08F 220/52
See application file for complete search history.

(56) References Cited

U.S. PATENT DOCUMENTS

| | | | |
|---|---|---|---|
| 9,029,070 B2 * | 5/2015 | Shimizu | G03F 7/0045 430/920 |
| 9,165,782 B2 | 10/2015 | Endo et al. | |
| 9,195,137 B2 | 11/2015 | Endo et al. | |
| 10,564,542 B2 * | 2/2020 | Jang | G03F 7/20 |
| 2012/0183903 A1 | 7/2012 | Hatakeyama et al. | |
| 2012/0183904 A1 | 7/2012 | Sagehashi et al. | |
| 2015/0086929 A1 | 3/2015 | Hatakeyama et al. | |
| 2016/0320702 A1 | 11/2016 | Ryu et al. | |
| 2019/0227438 A1 * | 7/2019 | Nishita | C09D 133/26 |
| 2019/0317405 A1 * | 10/2019 | Nishita | G03F 7/11 |

* cited by examiner

*Primary Examiner* — Amanda C. Walke
(74) *Attorney, Agent, or Firm* — Cantor Colburn LLP

(57) ABSTRACT

A polymer comprising a first repeating unit including an amino group protected by an alkoxycarbonyl group; a second repeating unit including a nucleophilic group; and a third repeating unit including a crosslinkable group, wherein the first repeating unit, the second repeating unit, and the third repeating unit are different from each other.

18 Claims, No Drawings

POLYMERS, UNDERLAYER COATING COMPOSITIONS COMPRISING THE SAME, AND PATTERNING METHODS

FIELD OF THE INVENTION

This invention relates to polymers, their use in underlayer coating compositions and to patterning methods using such underlayer coating compositions. The polymers, compositions and methods of the invention find particular applicability to the semiconductor manufacturing industry in the formation of semiconductor devices.

BACKGROUND

Photoresists are photosensitive films for transfer of images to a substrate. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The images formed can be of positive- or negative-type depending on the photoresist and developer chemistries.

Known photoresists can provide features having resolution and dimensions sufficient for many existing commercial applications. However, for many other applications, the need exists for new materials and processes that can provide highly resolved images of submicron dimension.

Reflection of activating radiation used to expose a photoresist often poses limits on resolution of the image patterned in the photoresist layer. The amount of scattering and reflection of imaging radiation will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. Such layers have also been referred to as antireflective layers, BARCs, or underlayers. See U.S. Pat. No. 9,541,834; US20150212414; U.S. Pat. No. 6,767,689B2; U.S. Pat. No. 6,887,648B2; and U.S. Pat. No. 8,623,589.

With continuing reductions in feature sizes of semiconductor devices, photoresist patterning defects in the form of pattern collapse during photoresist development have become more pervasive. This is particularly problematic for pillar and line/space patterns formed in ArF and EUV lithography. A large pattern collapse margin would be desired to allow for an improvement in lithography process window.

Pattern collapse margin is largely dependent on film properties of the layer below and in contact with the photoresist layer, for example, a BARC or EUV photoresist underlayer. Control of basicity of the underlayer at the interface with the photoresist layer can positively impact pattern collapse margin. To control basicity of the underlayer, the use of photobase generator additives or photodecomposable quencher (PDQs) additives are known. The concentration of such additives in the surface region of the underlayer can, however, become reduced during photoresist spin-coating due to dissolution in the photoresist composition solvent. This reduction can result in a diminished or eliminated effectiveness on pattern collapse margin.

It would be desirable to have new polymers and underlayer coating compositions containing such polymers useful in forming a photoresist underlayer.

SUMMARY

Provided is a polymer including a first repeating unit including an amino group protected by an alkoxycarbonyl group; a second repeating unit including a nucleophilic group; and a third repeating unit including a crosslinkable group, wherein the first repeating unit, the second repeating unit, and the third repeating unit are different from each other.

Also provided is an underlayer coating composition including the polymer, an acid catalyst, and a solvent.

Another aspect provides a coated substrate including a layer of the underlayer coating composition disposed on a substrate; and a photoresist layer disposed on the layer of the underlayer coating composition.

Still another aspect provides a patterning method including applying a layer of the underlayer coating composition on a substrate; baking the underlayer coating composition to form an underlayer film; applying a layer of a photoresist composition on the underlayer film to form a photoresist layer; pattern-wise exposing the photoresist layer to activating radiation; and developing the exposed photoresist layer to provide a resist relief image.

DETAILED DESCRIPTION

Reference will now be made in detail to exemplary aspects, examples of which are illustrated in the present description. In this regard, the present exemplary aspects may have different forms and should not be construed as being limited to the descriptions set forth herein. Accordingly, the exemplary aspects are merely described below to explain aspects of the present description. The terminology used herein is for the purpose of describing particular aspects only and is not intended to be limiting.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of two; "cycloalkenyl group" refers to a non-aromatic cyclic divalent hydrocarbon group having at least three carbon atoms, with at least one carbon-carbon double bond; "alkynyl group" refers to a monovalent hydrocarbon group having at least one carbon-carbon triple bond; "aryl group" refers to a monovalent aromatic monocyclic or polycyclic ring system, and may include a group with an aromatic ring fused to at least one cycloalkyl or heterocycloalkyl ring; "arylene group" refers to an aryl group having a valence of two; "alkylaryl group" refers to an aryl group that has been substituted with an alkyl group; "arylalkyl group" refers to an alkyl group that has been substituted with an aryl group; "heterocycloalkyl group" refers to a cycloalkyl group having 1-3 heteroatoms as ring members instead of carbon; "heterocycloalkylene group" refers to a heterocycloalkyl group having a valence of two; "heteroaryl group" refers to an aromatic group having 1-4 heteroatoms as ring members instead of carbon; "aryloxy group" refers to "aryl-O—"; and "arylthio group" refers to "aryl-S—". The prefix "hetero" means that the compound or group includes at least one member that is a heteroatom (e.g., 1, 2, or 3 heteroatom(s)) instead of a carbon atom, wherein the heteroatom(s) is each independently N, O, S, Si, or P. The prefix "halo" means a group including one more of a fluoro, chloro, bromo, or iodo substituent instead of a hydrogen atom. A combination of halo groups (e.g., bromo and fluoro), or only fluoro groups may be present. The term "(meth)acrylate" is inclusive of both methacrylate and acrylate, the term "(meth)allyl" is inclusive of both methallyl and allyl, and the term "(meth)acrylamide" is inclusive of both methacrylamide and acrylamide.

"Substituted" means that at least one hydrogen atom on the group is replaced with another group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—NO$_2$), cyano (—CN), hydroxyl (—OH), oxo (=O), amino (—NH$_2$), mono- or di-(C$_{1-6}$)alkylamino, alkanoyl (such as a C$_{2-6}$ alkanoyl group such as acyl), formyl (—C(=O)H), carboxylic acid or an alkali metal or ammonium salt thereof, C$_{2-6}$ alkyl ester (—C(=O)O-alkyl or —OC(=O)-alkyl), C$_{7-13}$ aryl ester (—C(=O)O-aryl or —OC(=O)-aryl), amido (—C(=O)NR$_2$ wherein R is hydrogen or C$_{1-6}$ alkyl), carboxamido (—CH$_2$C(=O)NR$_2$ wherein R is hydrogen or C$_{1-6}$ alkyl), halogen (e.g., fluorine, chlorine, bromine), thiol (—SH), C$_{1-6}$ alkylthio (—S-alkyl), thiocyano (—SCN), C$_{1-6}$ alkyl, C$_{2-6}$ alkenyl, C$_{2-6}$ alkynyl, C$_{1-6}$ haloalkyl, C$_{1-9}$ alkoxy, C$_{1-6}$ haloalkoxy, C$_{3-12}$ cycloalkyl, C$_{5-18}$ cycloalkenyl, C$_{6-12}$ aryl having at least one aromatic ring (e.g., phenyl, biphenyl, naphthyl, or the like, each ring either substituted or unsubstituted aromatic), C$_{7-19}$ arylalkyl having 1 to 3 separate or fused rings and from 6 to 18 ring carbon atoms, arylalkoxy having 1 to 3 separate or fused rings and from 6 to 18 ring carbon atoms, C$_{7-12}$ alkylaryl, C$_{4-12}$ heterocycloalkyl, C$_{3-12}$ heteroaryl, C$_{1-6}$ alkyl sulfonyl (—S(=O)$_2$-alkyl), C$_{6-12}$ arylsulfonyl (—S(=O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a C$_2$ alkyl group substituted with a cyano group.

Provided is a polymer including a first repeating unit including an amino group protected by an alkoxycarbonyl group; a second repeating unit including a nucleophilic group; and a third repeating unit including a crosslinkable group, wherein the first repeating unit, the second repeating unit, and the third repeating unit are different from each other. The first repeating unit provides a high pKa amine group as a basic cleavage product via thermal deprotection, for example by curing of the polymer. Preferably, the deprotected amine group has a pKa that is greater than 6. The disclosed polymer can improve pattern collapse margins of BARC and EUV underlayers by changing the basicity upon deprotection. In addition, the polymer is self-crosslinkable through the nucleophilic group of the second repeating unit and the crosslinkable group of the third repeating unit. The self-crosslinking can decrease the solubility of the crosslinked polymer so as to avoid dissolution from the underlayer during processing. The use of at least three different and particular types of repeating units in the polymer can provide significantly improved performance over traditional methods of controlling basicity with photo-base generator additives or photo-destroyable quencher additives.

As used herein, the term "copolymer" refers to polymers containing two or more distinct repeating units. Thus, the disclosed polymeric compounds of the invention can be referred to herein as a "polymer" or a "copolymer."

In an embodiment, the first repeating unit may be derived from a monomer of formula (1):

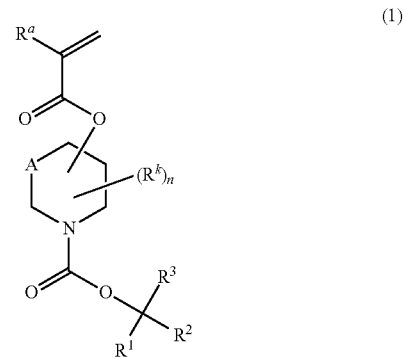

In formula (1), R$^a$ is hydrogen, fluorine, a substituted or unsubstituted C$_{1-5}$ alkyl, or a substituted or unsubstituted C$_{1-5}$ fluoroalkyl. Preferably, R$^a$ is hydrogen or methyl.

In formula (1), each R$^k$ is independently a halogen, a hydroxy, a carboxylic acid or ester, a thiol, a straight chain or branched C$_{1-20}$ alkyl, a monocyclic or polycyclic C$_{3-20}$ cycloalkyl, a monocyclic or polycyclic C$_{3-20}$ fluorocycloalkenyl, a monocyclic or polycyclic C$_{3-20}$ heterocycloalkyl, a monocyclic or polycyclic C$_{6-20}$ aryl, or a monocyclic or polycyclic C$_{4-20}$ heteroaryl, each of which is substituted or unsubstituted; and n is an integer of 0 to 11. Preferably, R$^k$ is a straight chain or branched C$_{1-20}$ alkyl and n is 1.

In formula (1), A is a single bond or a C$_{1-2}$ alkylene. Preferably, A is a single bond or a Cl alkylene to provide a 5- or 6-membered heterocyclic ring.

In formula (1), $R^1$, $R^2$, and $R^3$ are each independently a straight chain or branched $C_{1-20}$ alkyl, a monocyclic or polycyclic $C_{3-20}$ cycloalkyl, a monocyclic or polycyclic $C_{3-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted. In an embodiment, any two of $R^1$, $R^2$, and $R^3$ together optionally may form a ring. In a further embodiment, a polycyclic structure can be formed by $R^1$, $R^2$, and $R^3$.

Exemplary first repeating units derived from a monomer of formula (1) include, but are not limited to, the following:

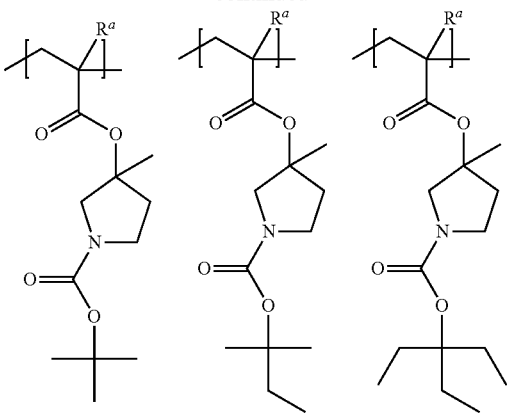

-continued

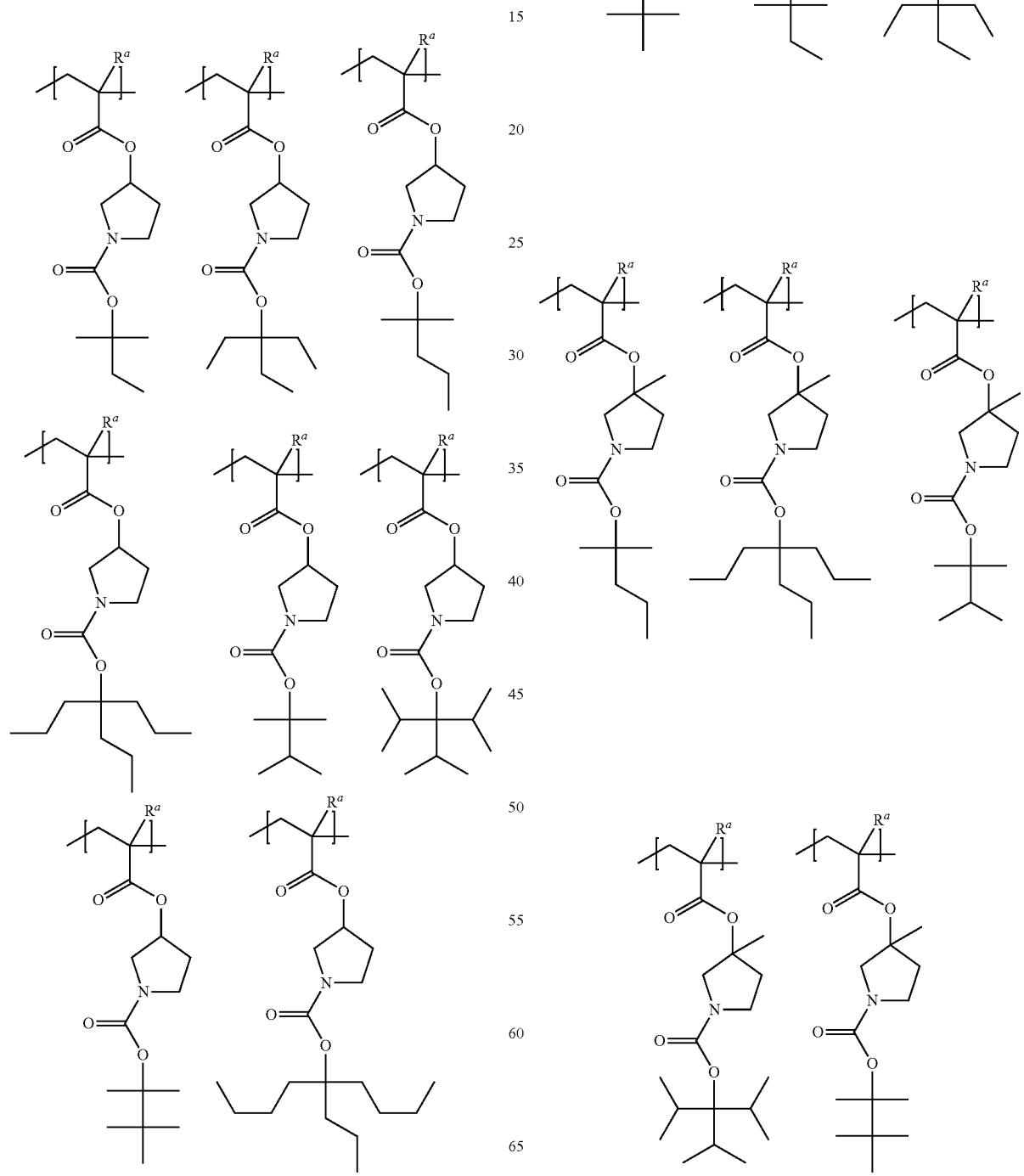

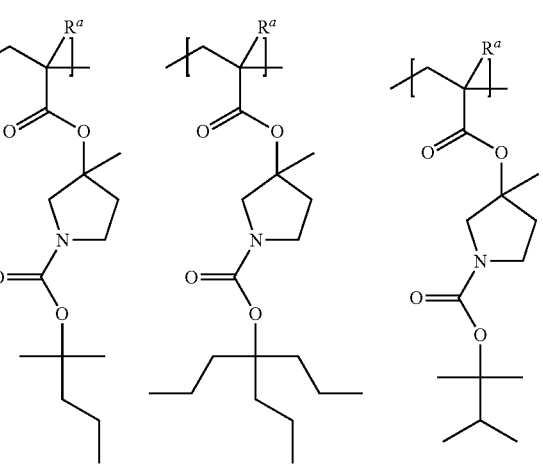

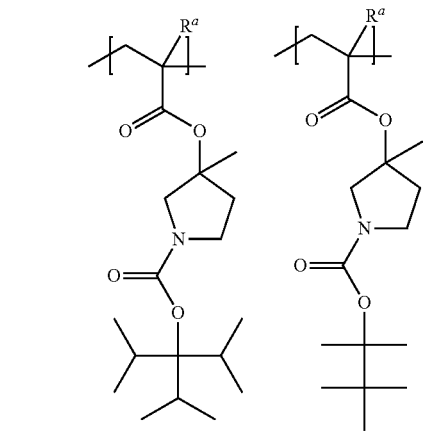

-continued
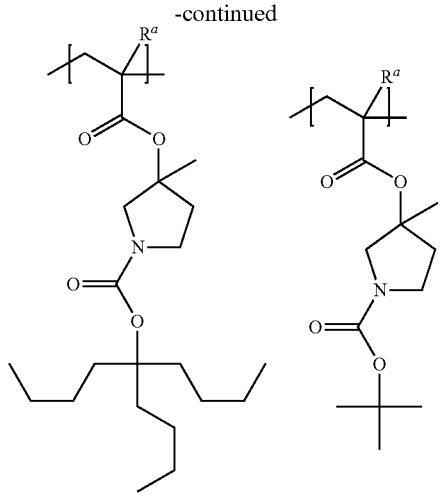
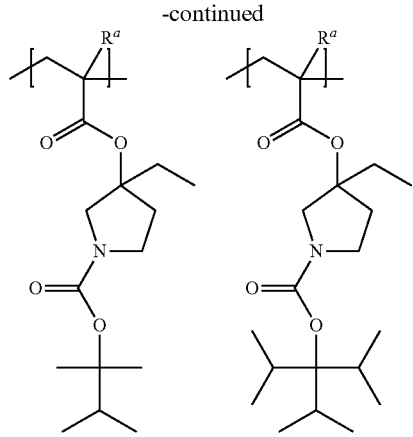
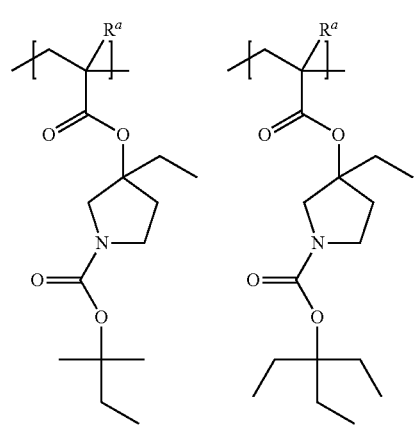
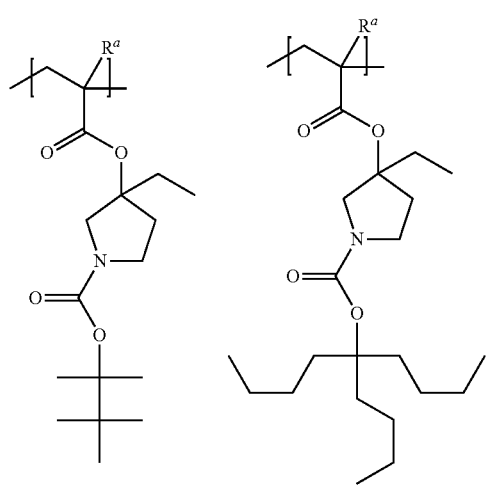
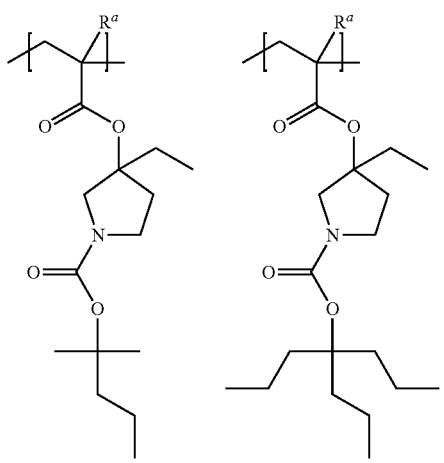
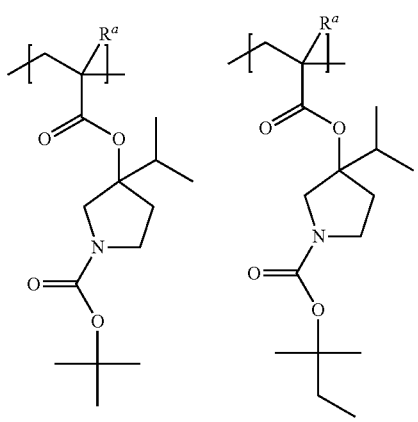

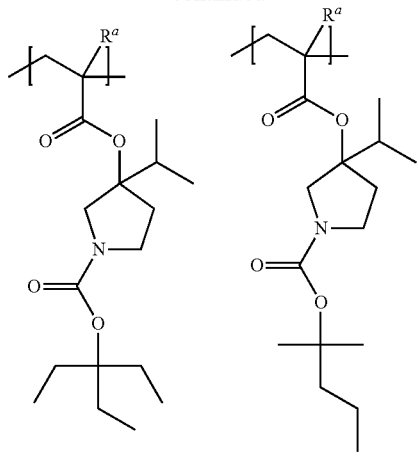
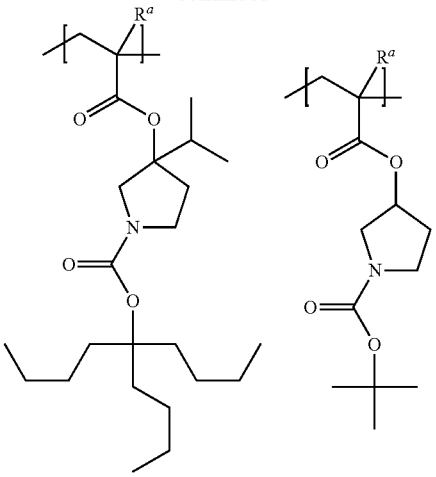
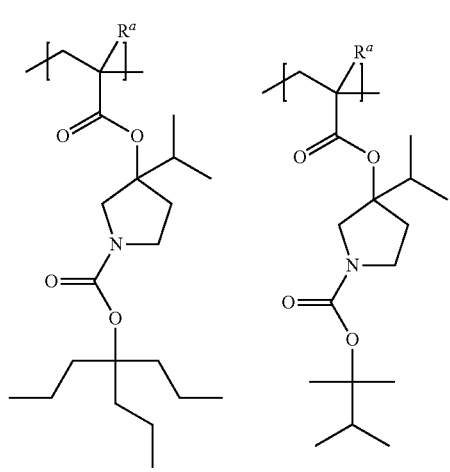
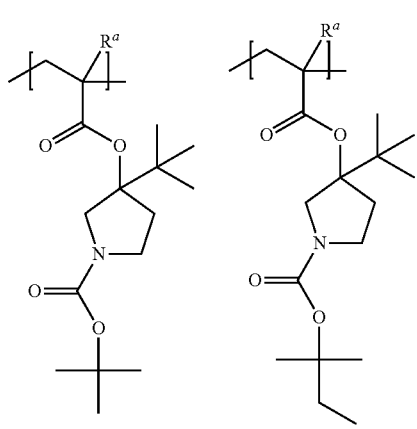
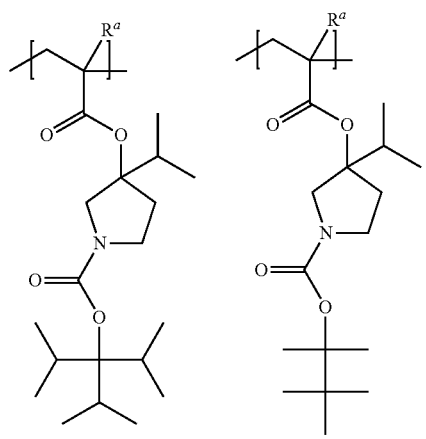

-continued
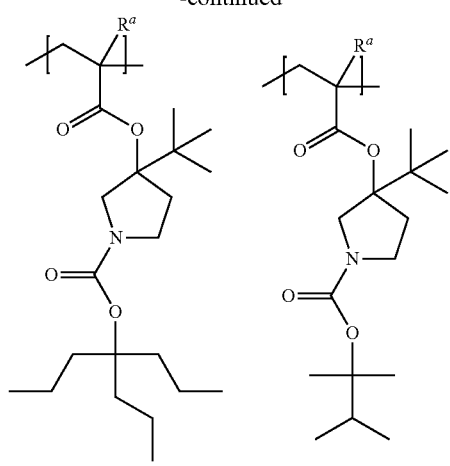 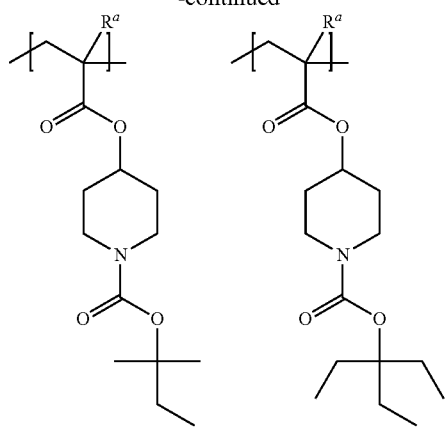
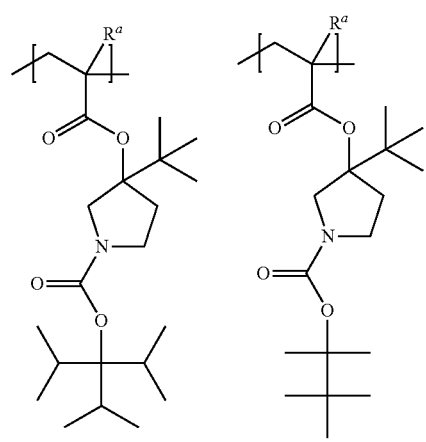 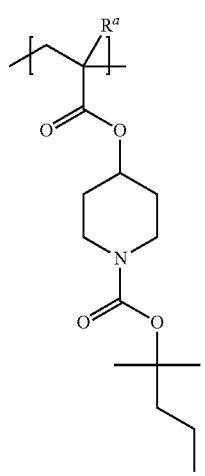
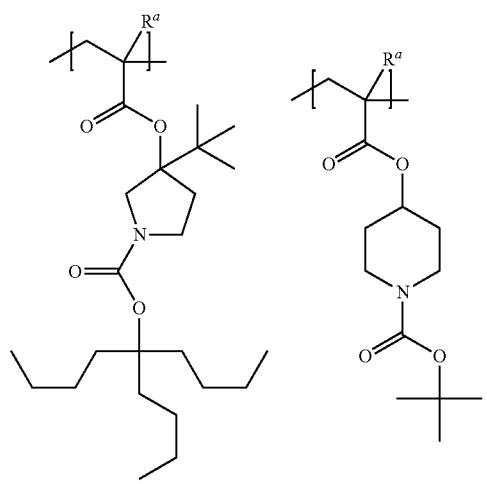 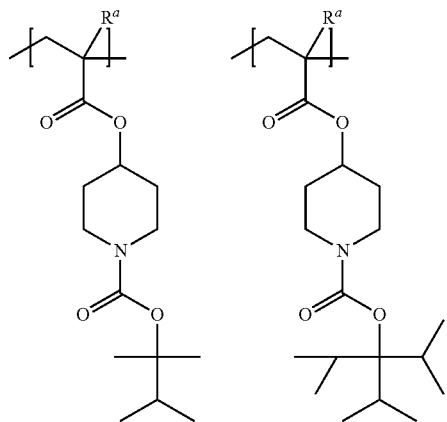

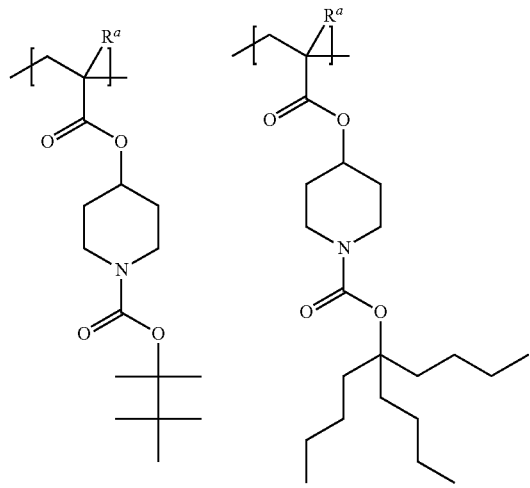
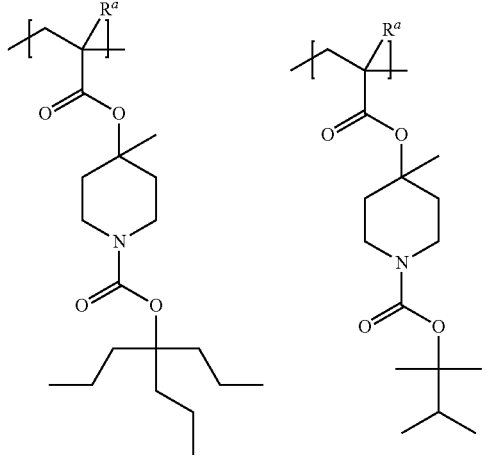
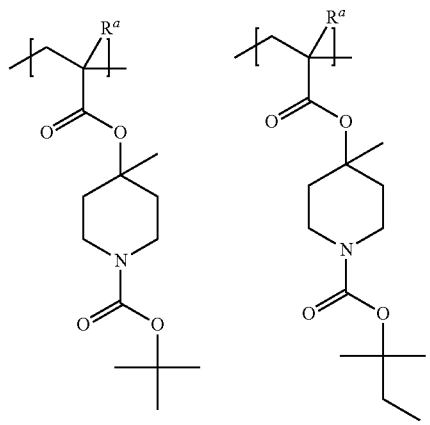
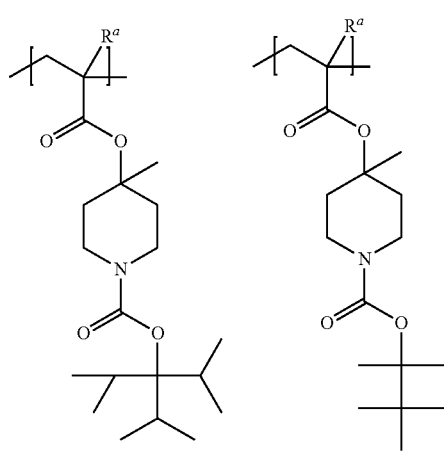
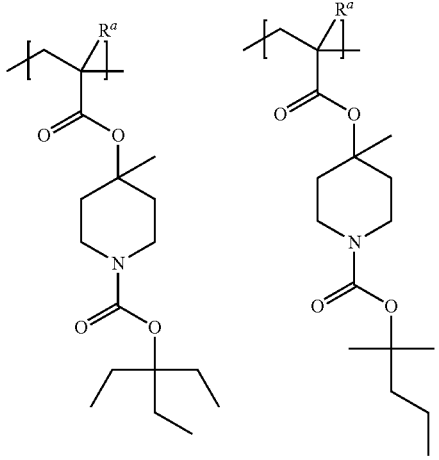
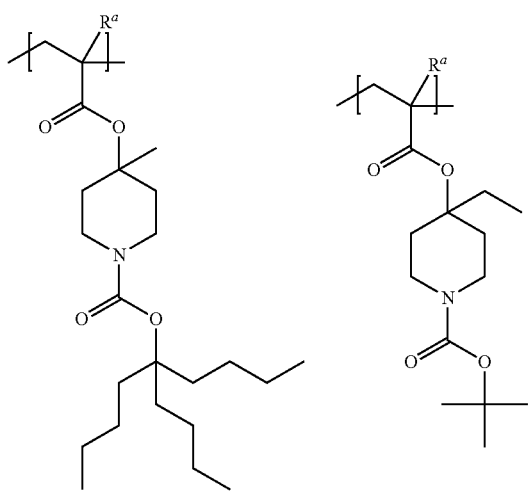

-continued
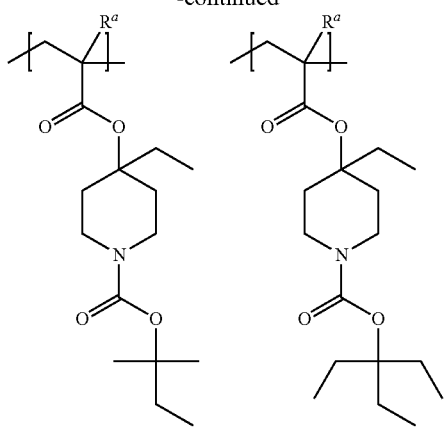
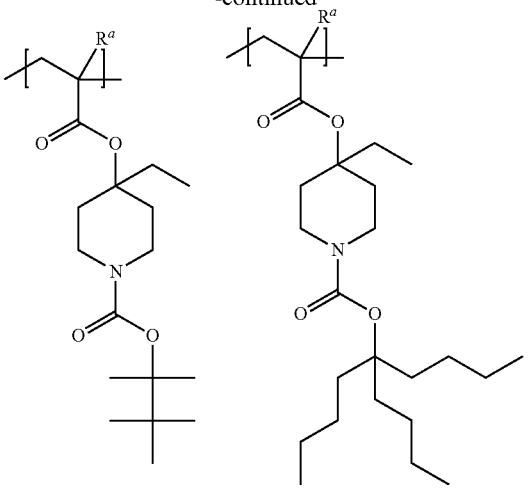
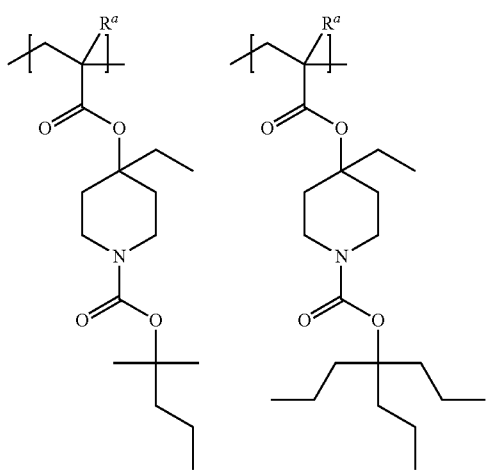
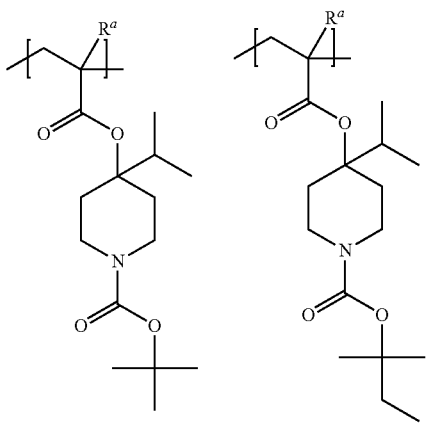
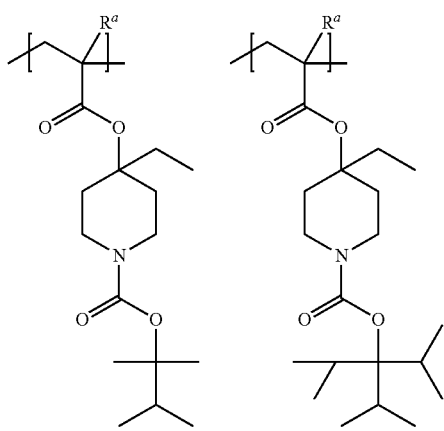
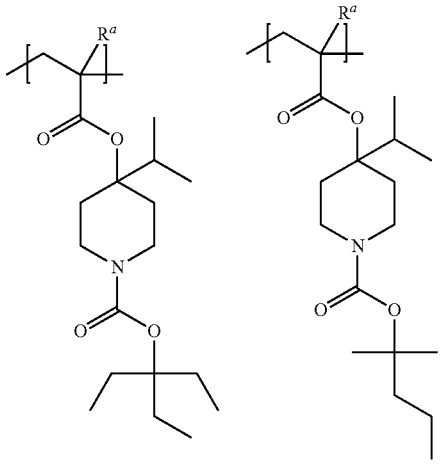

-continued
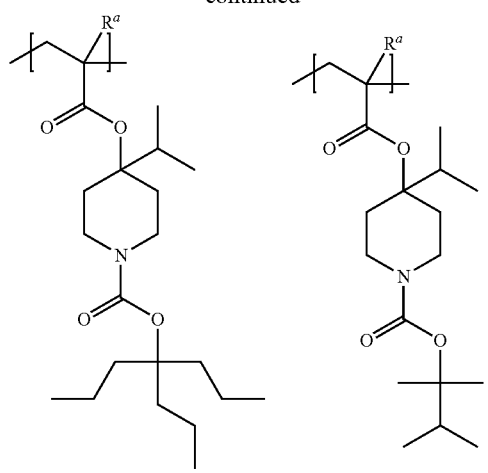
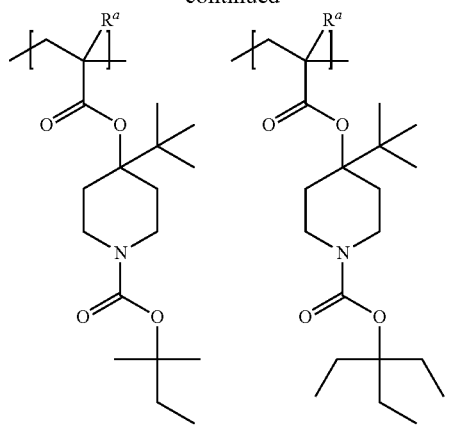
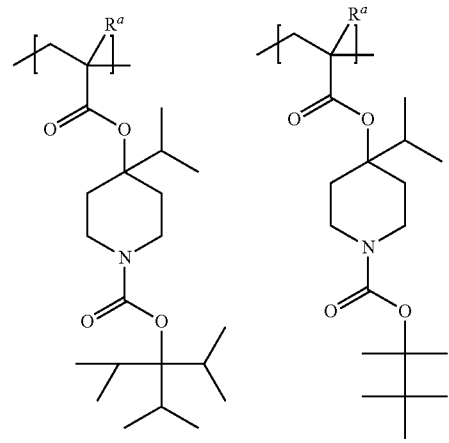
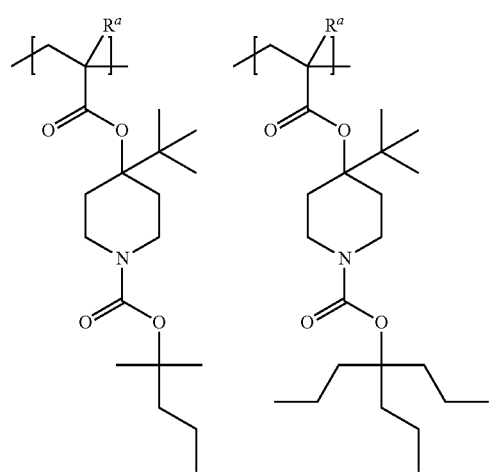
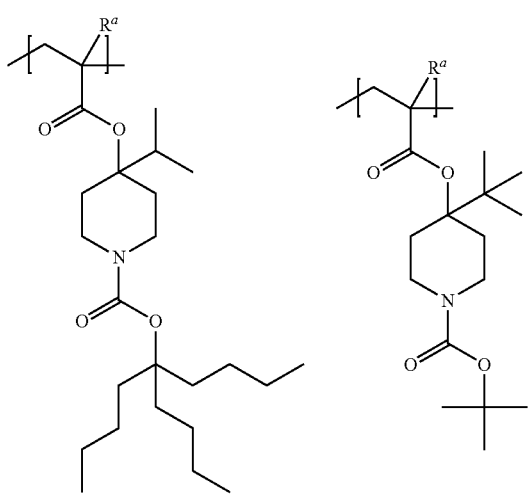
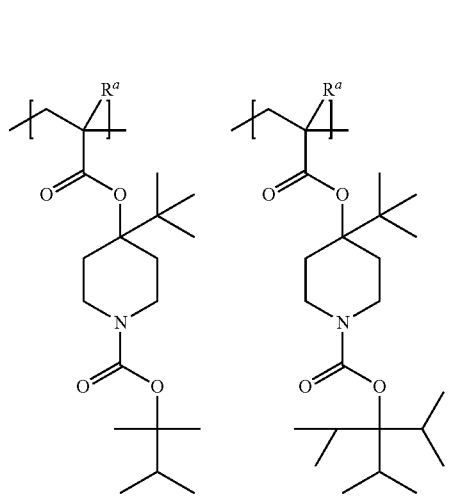

-continued

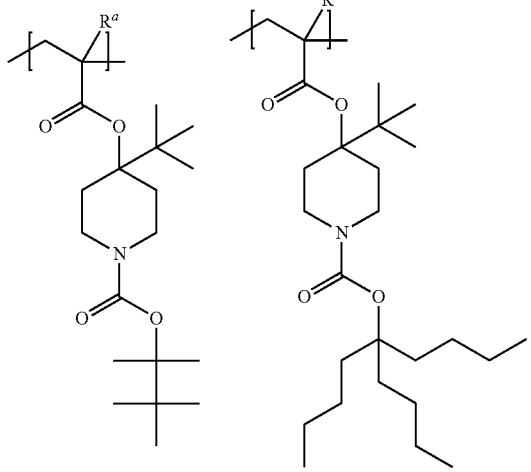

wherein $R^a$ is as defined in formula (1).

In another embodiment, the first repeating unit may be derived from a monomer of formula (2):

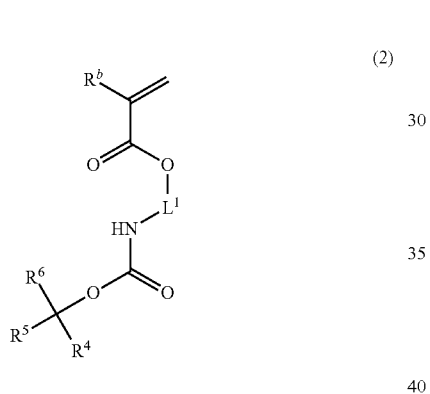

(2)

In formula (2), $R^b$ is hydrogen, fluorine, a substituted or unsubstituted $C_{1-5}$ alkyl, or a substituted or unsubstituted $C_{1-5}$ fluoroalkyl. Preferably, $R^b$ is hydrogen or methyl.

In formula (2), $L^1$ is a linking group. The linking group may include carbon and may optionally include one or more heteroatoms. In an example, $L^1$ may be a straight chain or branched $C_{1-20}$ alkylene, a monocyclic or polycyclic $C_{3-20}$ cycloalkylene, a monocyclic or polycyclic $C_{3-20}$ heterocycloalkylene, a monocyclic or polycyclic $C_{6-20}$ arylene, or a monocyclic or polycyclic $C_{4-20}$ heteroarylene, each of which is substituted or unsubstituted. Preferably, $L^1$ is a $C_{1-5}$ alkylene or a $C_{3-12}$ cycloalkylene.

In formula (2), $R^4$, $R^5$, and $R^6$ are each independently a straight chain or branched $C_{1-20}$ alkyl, a monocyclic or polycyclic $C_{3-20}$ cycloalkyl, a monocyclic or polycyclic $C_{3-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted. In an embodiment, any two of $R^4$, $R^5$, and $R^6$ together optionally may form a ring. In a further embodiment, a polycyclic structure can be formed by $R^4$, $R^5$, and $R^6$.

Exemplary first repeating units derived from a monomer of formula (2) include, but are not limited to, the following:

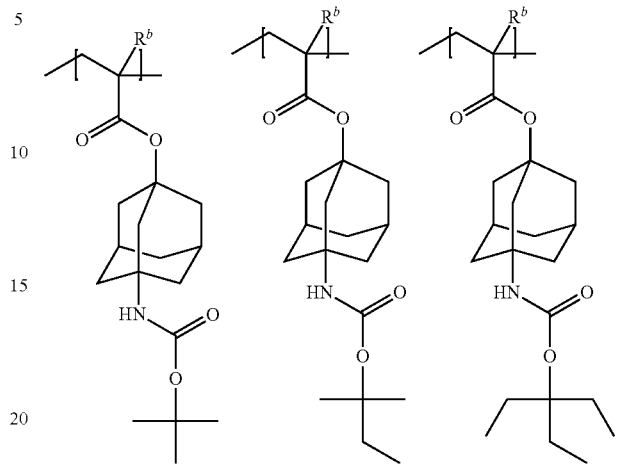

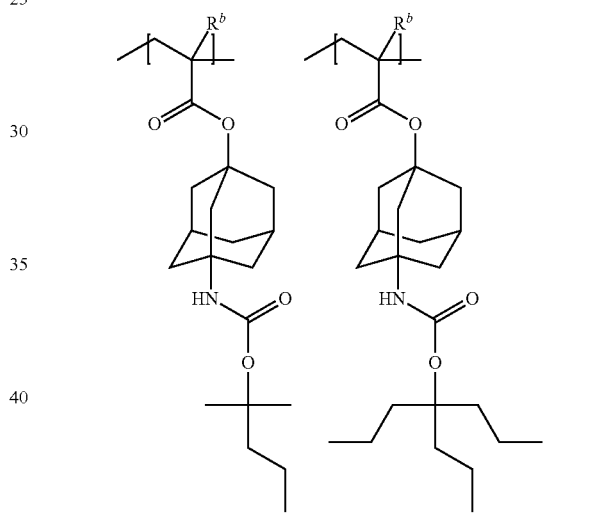

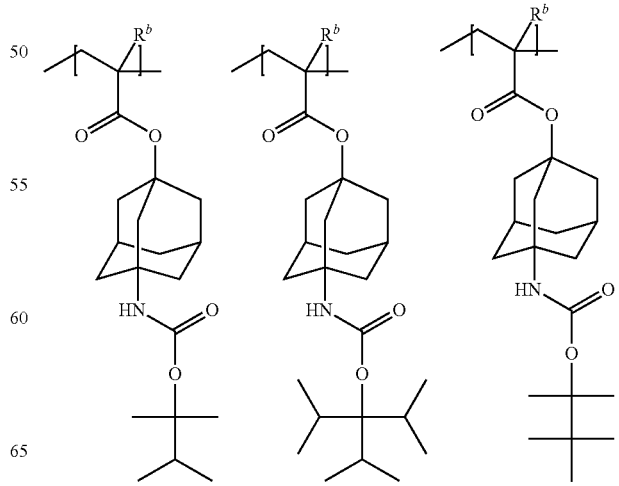

-continued
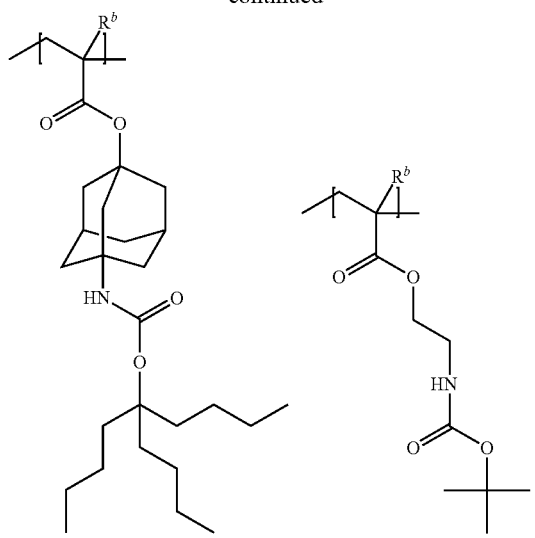
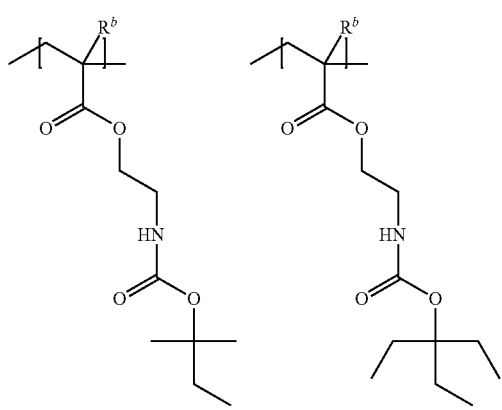
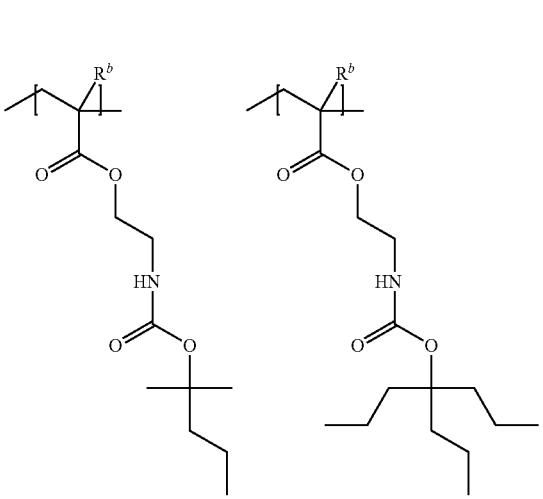
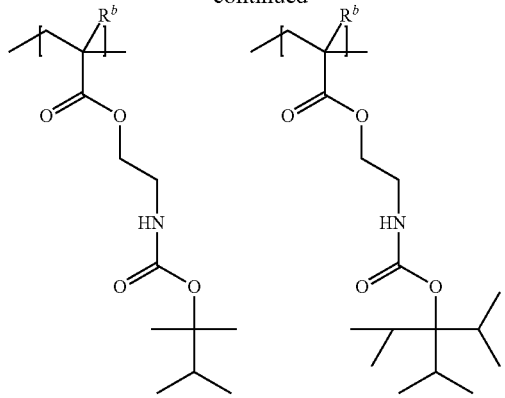
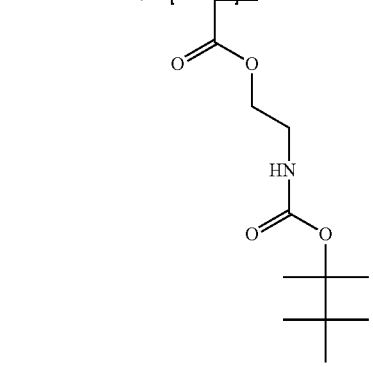
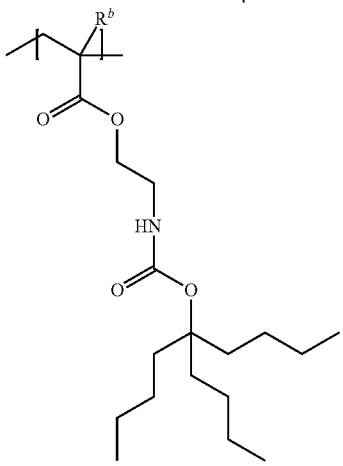
wherein $R^b$ is as defined in formula (2).
In an embodiment, the second repeating unit may be derived from a monomer of formula (3):
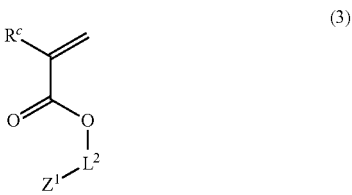
(3)
In formula (3), $R^c$ is hydrogen, fluorine, a substituted or unsubstituted $C_{1-5}$ alkyl, or a substituted or unsubstituted $C_{1-5}$ fluoroalkyl. Preferably, $R^c$ is hydrogen or methyl.

In formula (3), $L^2$ is a substituted or unsubstituted $C_{1-30}$ alkylene, a substituted or unsubstituted $C_{3-30}$ cycloalkylene, a substituted or unsubstituted $C_{3-30}$ heterocycloalkylene, a substituted or unsubstituted $C_{6-30}$ arylene, a substituted or unsubstituted divalent $C_{7-30}$ arylalkyl, a substituted or unsubstituted $C_{3-30}$ heteroarylene, or a substituted or unsubstituted divalent $C_{4-30}$ heteroarylalkyl. Preferably, $L^2$ is a substituted or unsubstituted $C_{1-10}$ alkylene.

In formula (3), $Z^1$ is a nucleophilic group that includes oxygen, nitrogen, or sulfur such as hydroxyl (—OH), carboxyl (—COOH), amine (—NH$_2$), thiol (—SH), or amido (—C(=O)NH$_2$) moiety. In an embodiment, $Z^1$ is hydroxyl, carboxyl, thiol, amino, or amido. Preferably, $Z^1$ is hydroxyl.

In an embodiment, the third repeating unit may be derived from a monomer of formula (4):

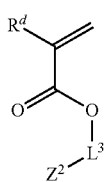

(4)

In formula (4), $R^d$ is hydrogen, fluorine, a substituted or unsubstituted $C_{1-5}$ alkyl, or a substituted or unsubstituted $C_{1-5}$ fluoroalkyl. Preferably, $R^d$ is hydrogen or methyl.

In formula (4), $L^3$ is a single bond, a substituted or unsubstituted $C_{1-30}$ alkylene, a substituted or unsubstituted $C_{3-30}$ cycloalkylene, a substituted or unsubstituted $C_{3-30}$ heterocycloalkylene, a substituted or unsubstituted $C_{6-30}$ arylene, a substituted or unsubstituted divalent $C_{7-30}$ arylalkyl, a substituted or unsubstituted $C_{3-30}$ heteroarylene, or a substituted or unsubstituted divalent $C_{4-30}$ heteroarylalkyl. Preferably, $L^3$ is a substituted or unsubstituted $C_{1-10}$ alkylene.

In formula (4), $Z^2$ is epoxy or lactone. For example, $Z^2$ may be epoxy, β-propiolactone, γ-butyrolactone, or δ-valerolactone, each of which can be substituted or unsubstituted. Preferably, $Z^2$ is epoxy.

In an embodiment, the polymer includes 5 to 60 mole percent (mol %), preferably 5 to 30 mol % of the first repeating unit; 20 to 65 mol %, preferably 30 to 65 mol % of the second repeating unit; and 20 to 65 mol %, preferably 30 to 65 mol % of the third repeating unit, each based on 100 mol % of total repeating units in the polymer. For example, the polymer includes 5 to 60 mol % of the first repeating unit derived from a monomer of formula (1) or formula (2); 20 to 65 mol % of the second repeating unit derived from a monomer of formula (3); and 20 to 65 mol % of the third repeating unit derived from a monomer of formula (4), each based on 100 mol % of total repeating units in the polymer.

The polymer may have a weight average molecular weight ($M_w$) from 2,000 grams per mole (g/mol) to 100,000 g/mol, for example, preferably from 10,000 to 50,000 g/mol, more preferably from 12,000 to 30,000 g/mol, with a polydispersity index (PDI) of 1.3 to 3, preferably 1.3 to 2, more preferably 1.4 to 2. Molecular weight is determined by gel permeation chromatography (GPC) using polystyrene standards.

Suitable polymers of the present invention can be readily prepared based on and by analogy with the procedures described in the examples of the present application, which are readily understood by those of ordinary skill in the art. For example, one or more monomers corresponding to the repeating units described herein may be combined, or fed separately, using suitable solvent(s) and initiator, and polymerized in a reactor. The monomer composition may further include additives, such as a solvent, a polymerization initiator, a curing catalyst (i.e., the acid catalyst), and the like. For example, the polymer may be obtained by polymerization of the respective monomers under any suitable conditions, such as by heating at an effective temperature, irradiation with activating radiation at an effective wavelength, or a combination thereof.

Also provided is an underlayer coating composition including the polymer described herein, an acid catalyst, and a solvent. Typically, the polymer is present in the underlayer coating composition in an amount of from 70 to 99 wt %, more preferably 75 to 95 wt % of the solids content of the underlayer coating composition.

The underlayer coating composition may further include one or more polymers ("additional polymers") in addition to the inventive polymer described above. For example, the underlayer coating composition may further include an additional polymer as described above but different in composition, or a polymer that is similar to those described above but does not include each of the three different requisite monomer types. Additionally or alternatively, the one or more additional polymers can include those well known in the art, for example, polyacrylates, polyvinylethers, polyesters, polynorbornenes, polyacetals, polyethylene glycols, polyamides, polyacrylamides, polyphenols, novolacs, styrenic polymers, and polyvinyl alcohols.

The acid catalyst may include a free acid and/or an acid generator that can function to promote hardening or crosslinking of composition components. Thermal-induced crosslinking of the underlayer coating composition by activation of an acid generator is generally preferred. Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid.

Typically, one or more free acids may be present in the underlayer coating composition in a concentration from 0.1 to 15 wt %, more preferably 0.5 to 10 wt % of the solids content of the underlayer coating composition.

Suitable thermal acid generators (TAGs) include nonionic or ionic compounds. Suitable nonionic thermal acid generators include, for example, cyclohexyl trifluoromethyl sulfonate, methyl trifluoromethyl sulfonate, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl and heteroaryl sulfonate salts, aliphatic sulfonate salts, benzenesulfonate salts and ammonium triflate salts including benzylpyridium and benzylanilinium salts of triflic acid. Compounds that generate a sulfonic acid or a triflic acid upon activation are generally suitable. Preferred thermal acid generators include p-toluenesulfonic acid ammonium salts, ammonium triflate salts, and heteroaryl sulfonate salts. In an embodiment, the acid catalyst is pyridinium p-toluenesulfonate.

Typically, one or more thermal acid generators may be present in the underlayer coating composition in a concentration from 0.1 to 15 wt %, more preferably 0.5 to 10 wt % of the solids content of the underlayer coating composition.

The solvent component of the underlayer coating composition may be a single solvent or may include a mixture of two or more distinct solvents. Suitably, each of the multiple solvents may be miscible with each other. Suitable solvents include, for example, one or more oxyisobutyric acid esters, particularly methyl-2-hydroxyisobutyrate, 2-hydroxyisobutyric acid, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone.

The underlayer coating composition may include one or more optional additives including, for example, surfactants and antioxidants. Such optional additives if used are each typically present in the underlayer coating composition in minor amounts such as from 0.01 to 10 wt % based on solids content of the underlayer coating composition.

Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON X-114, X-100, X-45, X-15 and branched secondary alcohol ethoxylates such as TERGITOL TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, Pa. and sold under the trade names of SURFYNOL™ and DYNOL™. Additional suitable surfactants include other polymeric compounds such as the triblock EO-PO-EO co-polymers PLURONIC™ 25R2, L121, L123, L31, L81, L101 and P123 (BASF, Inc.).

An antioxidant can be added to prevent or minimize oxidation of organic materials in the underlayer coating composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethyl-amino-p-cresol, 6-(4-hydroxy-3,5-di-tert-butyl.anilino)2,4-bis.octyl-thio-1,3,5-triazine, n-octadecyl-3-(4'-hydroxy-3', 5'-di-tert-butyl.phenyl)propionate, octylated phenol, aralkyl-substituted phenols, alkylated p-cresol and hindered phenol; bis-, tris- and poly-phenols such as 4,4'-dihydroxy-.diphenyl, methylene.bis(dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2, 4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl) propionate]methane. Suitable antioxidants are commercially available, for example, Irganox™ antioxidants (Ciba Specialty Chemicals Corp.).

The desired total solids content of the compositions will depend on factors such as the desired final layer thickness. Typically, the solids content of the underlayer coating composition may be from 0.1 to 20 wt %, for example, from 0.1 to 10 wt %, more typically, from 0.11 to 5 wt %, based on the total weight of the underlayer coating composition. As used herein, the "solids content" of an underlayer coating composition refers to all materials of the underlayer coating composition except the solvent carrier.

The underlayer coating compositions may be prepared following known procedures. For example, the underlayer coating compositions may be prepared by combining the polymer, the acid catalyst, the solvent, and any optional components, in any order. The underlayer coating compositions may be used as is, or may be subjected to purification prior to being coated on the substrate. Purification may involve, for example, one or more of centrifugation, filtration, distillation, decantation, evaporation, treatment with ion exchange beads, and the like.

The patterning methods of the present invention comprise applying a layer of the underlayer coating composition on a substrate; baking the underlayer coating composition to form an underlayer film; applying a layer of a photoresist composition on the underlayer film to form a photoresist layer; pattern-wise exposing the photoresist layer to activating radiation; and developing the exposed photoresist layer to provide a resist relief image.

A wide variety of substrates may be used in the patterning methods, with electronic device substrates being typical. Suitable substrates include, for example, packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Typical wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

The substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. The substrate may include one or more layers and patterned features. The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers can be formed by various techniques, for example, chemical vapor deposition (CVD) such as plasma-enhanced CVD (PECVD), low-pressure CVD (LPCVD) or epitaxial growth, physical vapor deposition (PVD) such as sputtering or evaporation, or electroplating.

It may be desired in certain patterning methods of the invention to provide one or more lithographic layers such as a hardmask layer, for example, a spin-on-carbon (SOC), amorphous carbon, or metal hardmask layer, a CVD layer such as a silicon nitride (SiN) layer, silicon oxide (SiO) layer, or silicon oxynitride (SiON) layer, an organic or inorganic BARC layer, or a combination thereof, on an upper surface of the substrate prior to forming the photoresist underlayer of the invention. Such layers, together with an overcoated underlayer of the invention and photoresist layer, form a lithographic material stack. Typical lithographic stacks which may be used in the patterning methods of the invention include, for example, the following: SOC layer/underlayer/photoresist layer; SOC layer/SiON layer/underlayer/photoresist layer; SOC layer/SiARC layer/underlayer/photoresist layer; SOC layer/metal hardmask layer/underlayer/photoresist layer; amorphous carbon layer/underlayer/photoresist layer; and amorphous carbon layer/SiON layer/underlayer/photoresist layer.

The underlayer coating composition may be coated on the substrate by any suitable means, such as spin-coating, slot-die coating, doctor blading, curtain-coating, roller-coating, spray-coating, dip-coating, and the like. In the case of a semiconductor wafer, spin-coating is preferred. In a typical spin-coating method, the present compositions are applied to a substrate which is spinning at a rate of 500 to 4000 rpm for a period of 15 to 90 seconds to obtain a desired layer of the condensed polymer on the substrate. It will be appreciated by those skilled in the art that the thickness of the coated layer may be adjusted by changing the spin speed, as well as the solids content of the composition. An underlayer formed from the underlayer coating composition typically has a dried layer thickness of from 1 to 50 nm, more typically from 1 to 10 nm.

The coated underlayer composition is optionally soft-baked at a relatively low temperature to remove any solvent and other relatively volatile components from the underlayer composition. Typically, the substrate is baked at a temperature of less than or equal to 150° C., preferably from 60 to 125° C., and more preferably from 90 to 115° C. The baking time is typically from 10 seconds to 10 minutes, preferably from 30 seconds to 5 minutes, and more preferably from 6 to 90 seconds. When the substrate is a wafer, such baking step may be performed by heating the wafer on a hot plate. Such soft-baking step may be performed as part of the curing of the coating layer, or may be omitted altogether.

The coated underlayer composition is then cured to form an underlayer. The composition should be sufficiently cured such that the underlayer does not intermix, or minimally intermixes, with a photoresist layer to be formed on the underlayer. The coated underlayer composition may be cured in an oxygen-containing atmosphere, such as air, or in an inert atmosphere, such as nitrogen and under conditions, such as heating, sufficient to provide a cured coating layer. This curing step is preferably conducted on a hot plate-style apparatus, although oven curing may be used to obtain equivalent results. The curing temperature should be sufficient for the acid catalyst to effect curing throughout the layer, for example, sufficient to allow a free acid to effect crosslinking, or to allow a thermal acid generator to liberate acid and the liberated acid to effect crosslinking where the acid catalyst is a TAG. Typically, the curing is conducted at a temperature of 150° C. or greater, and preferably 150 to 450° C. It is more preferred that the curing temperature is 180° C. or greater, still more preferably 200° C. or greater, and even more preferably from 200 to 400° C. The curing time is typically from 10 seconds to 10 minutes, preferably from 30 seconds to 5 minutes, more preferably from 45 seconds to 2 minutes, and still more preferably from 45 to 90 seconds. Optionally, a ramped or a multi-stage curing process may be used. A ramped bake typically begins at a relatively low (e.g., ambient) temperature that is increased at a constant or varied ramp rate to a higher target temperature. A multi-stage curing process involves curing at two or more temperature plateaus, typically a first stage at a lower bake temperature and one or more additional stages at a higher temperature. Conditions for such ramped or multi-stage curing processes are known to those skilled in the art, and may allow for omission of a preceding softbake process.

After curing of the underlayer composition, a photoresist layer is formed on the underlayer.

A wide variety of photoresists may be suitably used in the methods of the invention and are typically positive-tone materials. The particular photoresists to be used will depend on the exposure wavelength used and generally comprise an acid-sensitive matrix polymer, a photoactive component such as a photoacid generator, a solvent and optional additional components. Suitable photoresists are known to those skilled in the art and are commercially available, for example, various photoresist materials in the UV™ and EPIC™ product families from DuPont Electronics & Imaging. The photoresist can be applied to the substrate by known coating techniques such as described above with reference to the underlayer composition, with spin-coating being typical. A typical thickness for the photoresist layer is from 10 to 300 nm. The photoresist layer is typically next softbaked to minimize the solvent content in the layer, thereby forming a tack-free coating and improving adhesion of the layer to the substrate. The softbake can be conducted on a hotplate or in an oven, with a hotplate being typical. Typical softbakes are conducted at a temperature of from 70 to 150° C., and a time of from 30 to 90 seconds.

The photoresist layer is next exposed to activating radiation through a photomask to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, and more typically, sub-300 nm, such as 248 nm (KrF), 193 nm (ArF) or an EUV wavelength (e.g., 13.5 nm). In a preferred aspect, the exposure wavelength is 193 nm or an EUV wavelength. The exposure energy is typically from 10 to 100 mJ/cm$^2$, depending, for example, on the exposure tool and the components of the photosensitive composition.

Following exposure of the photoresist layer, a post-exposure bake (PEB) is typically performed. The PEB can be conducted, for example, on a hotplate or in an oven. The PEB is typically conducted at a temperature of from 70 to 150° C., and a time of from 30 to 90 seconds. A latent image defined by the boundary between polarity-switched and unswitched regions (corresponding to exposed and unexposed regions, respectively) is thereby formed. The photoresist layer is next developed to remove the exposed regions of the layer, leaving the unexposed regions forming a patterned photoresist layer. The developer is typically an aqueous alkaline developer, for example, a tetra-alkyl ammonium hydroxide solution such as a tetramethylammonium hydroxide (TMAH) solution, typically 0.26 Normality (N) (2.38 wt %) TMAH. The developer may be applied to the substrate by known techniques, for example, spin-coating or puddle coating.

The pattern of the photoresist layer can then be transferred to one or more underlying layers including the underlayer and to the substrate by appropriate etching techniques, such as by plasma etching using appropriate gas species for each layer being etched. Depending on the number of layers and materials involved, pattern transfer may involve multiple etching steps using different etching gases. The patterned photoresist layer, underlayer, and other optional layers in the lithographic stack may be removed following pattern transfer of the substrate using conventional techniques. Optionally, one or more of the layers of the stack may be removed following, or consumed during, pattern transfer to an underlying layer and prior to pattern transfer to the substrate. The substrate is then further processed according to known processes to form an electronic device.

Hereinafter, the present disclosure is illustrated in more detail with reference to examples. However, these examples are exemplary, and the present invention is not limited thereto.

EXAMPLES

Polymer Synthesis

Example 1

4-Hydroxyphenyl methacrylate (HQMA) (18.2 grams (g)), glycidyl methacrylate (GMA) (7.3 g), tert-butyl 4-(methacryloyloxy)piperidine methacrylate (TBPMA) (4.6 g), and dimethyl 2,2'-azobis(2-methylpropionate) (V601) (3.5 g) were dissolved in 32.5 g of ethyl lactate (EL)/gamma-butyrolactone (GBL) (EL:GBL=70:30 wt % ratio) in a first round-bottom flask (RBF) at room temperature with stirring. Separately, EL/GBL (37.5 g) was charged into a second RBF equipped with a condenser and a magnetic stirrer. The second flask was heated at 90° C. with stirring and the contents of the first RBF were added thereto dropwise over 3 hours. After monomer feeding was completed, the reaction mixture was stirred for an additional hour at 90° C. The reaction mixture was cooled to room temperature and precipitated to methyl tert-butyl ether (MTBE, 1000 g). The solids were isolated and dried under vacuum at 40° C. for 16 hrs. The copolymer includes the repeating units HQMA:GMA:TBPMA in a ratio of 60.6:30.4:9.0 and has a $M_w$ of 9.2 kg/mol as determined by GPC).

Example 2

HQMA (15.1 g), GMA (5.9 g), TBPMA (9.0 g), and V601 (2.6 g) were dissolved in 32.5 g of EL/GBL (70:30 wt/w ratio) in a first RBF at room temperature with stirring. Separately, EL/GBL (37.5 g) was charged into a second RBF equipped with a condenser and a magnetic stirrer. The second flask was heated at 90° C. with stirring and the contents of the first RBF were added thereto dropwise over 3 hours. After monomer feeding was completed, the reaction mixture was stirred for an additional hour at 90° C. The reaction mixture was cooled to room temperature and precipitated with MTBE (1000 g). The solids were isolated and dried under vacuum at 40° C. for 16 hrs. The copolymer includes the repeating units HQMA:GMA:TBPMA in a ratio of 56.5:27.0:16.5 and has a $M_w$ of 11.8 kg/mol as determined by GPC).

Example 3

2-Hydroxyethyl methacrylate (HEMA) (15.9 g), GMA (5.5 g), TBPMA (5.5 g), and V601 (5.6 g) were dissolved in 32.5 g of EL/GBL (70:30 wt/w ratio) in a first RBF at room temperature with stirring. Separately, EL/GBL (37.5 g) was charged into a second RBF equipped with a condenser and a magnetic stirrer. The second flask was heated at 80° C. with stirring and the contents of the first RBF were added thereto dropwise over 2 hours. After monomer feeding was completed, the reaction mixture was stirred for an additional hour at 80° C. The reaction mixture was cooled to room temperature and precipitated with MTBE (1000 g). The resulting product was re-dissolved in THF (120 g) and precipitated with MTBE (1500 g). The solids were isolated and dried under vacuum at 40° C. for 16 hrs. The copolymer includes the repeating units HEMA:GMA:TBPMA in a ratio of 63.4:26.6:10.0 and has a $M_w$ of 7.7 kg/mol as determined by GPC).

Example 4

HQMA (19.8 g), GMA (7.9 g), tert-butyl 4-(methacryloyloxy)-4-methylpiperidine-1-carboxylate (TBMPMA) (5.3 g), and V601 (3.5 g) were dissolved in 32.5 g of EL/GBL (70:30 wt/w ratio) in a first RBF at room temperature with stirring. Separately, EL/GBL (37.5 g) was charged into a second RBF equipped with a condenser and a magnetic stirrer. The second flask was heated at 90° C. with stirring and the contents of the first RBF were added thereto dropwise over 3 hours. After monomer feeding was completed, the reaction mixture was stirred for an additional hour at 90° C. The reaction mixture was cooled to room temperature and precipitated with MTBE (1000 g). The solids were isolated and dried under vacuum at 40° C. for 16 hrs. The copolymer includes the repeating units HQMA:GMA:TBMPMA in a ratio of 58.9:30.9:10.2 and has a $M_w$ of 9.0 kg/mol as determined by GPC).

Example 5

HQMA (19.6 g), GMA (7.8 g), tert-butyl 4-ethyl-4-(methacryloyloxy)piperidine-1-carboxylate (TBEPMA) (5.5 g), and V601 (3.5 g) were dissolved in 32.5 g of EL/GBL (70:30 wt/w ratio) in a first RBF at room temperature with stirring. Separately, EL/GBL (37.5 g) was charged into a second RBF equipped with a condenser and a magnetic stirrer. The second flask was heated at 90° C. with stirring and the contents of the first RBF were added thereto dropwise over 3 hours. After monomer feeding was completed, the reaction mixture was stirred for an additional hour at 90° C. The reaction mixture was cooled to room temperature and precipitated with MTBE (1000 g). The solids were isolated and dried under vacuum at 40° C. for 16 hrs. The copolymer includes the repeating units HQMA:GMA:TBEPMA in a ratio of 59.3:31.0:9.7 and has a $M_w$ of 10.5 kg/mol as determined by GPC).

Example 6

HQMA (20.5 g), GMA (7.8 g), 2-((tert-butoxycarbonyl)amino)ethyl methacrylate (TBAEMA) (4.4 g), and V601 (3.5 g) were dissolved in 32.5 g of EL/GBL (70:30 wt/w ratio) in a first RBF at room temperature with stirring. Separately, EL/GBL (37.5 g) was charged into a second RBF equipped with a condenser and a magnetic stirrer. The second flask was heated at 90° C. with stirring and the contents of the first RBF were added thereto dropwise over 3 hours. After monomer feeding was completed, the reaction mixture was stirred for an additional hour at 90° C. The reaction mixture was cooled to room temperature and precipitated with MTBE (1000 g). The solids were isolated and dried under vacuum at 40° C. for 16 hrs. The copolymer includes the repeating units HQMA:GMA:TBAEMA in a ratio of 60.1:29.5:10.4 and has a $M_w$ of 11.3 kg/mol as determined by GPC.

Example 7

GMA (21.8 g) and HQMA (18.2 g) were dissolved in 40 g of EL in a first RBF at room temperature with stirring. Separately, EL (80 g) was charged into a second RBF equipped with a condenser and a magnetic stirrer. The second flask was heated at 90° C. with stirring and the contents of the first RBF were added thereto dropwise over 3 hours. After monomer feeding was completed, the reaction mixture was stirred for an additional hour at 90° C. The reaction mixture was cooled to room temperature and precipitated with MTBE (1000 g). The solids were isolated and dried under vacuum at 40° C. for 16 hrs. The copolymer includes the repeating units GMA:HQMA in a ratio of 60.3:39.7 and has a $M_w$ of 4.7 kg/mol as determined by GPC).

Preparation of Anti-Reflective Compositions

Compositions were prepared by combining one of the copolymers of Example 1 to 7, 2,4,6-trimethylpyridinium p-toluenesulfonate, methyl 2-hydroxyisobutyrate (8.308 g), 1-methoxy-2-propyl acetate (20.769 g), and methyl-2-pyrrolidone (0.593 g). Table 1 lists the compositions.

TABLE 1

| Example | Copolymer | Copolymer amount (g) | 2,4,6-trimethylpyridinium p-toluenesulfonate (g) |
|---|---|---|---|
| 8 | Example 1 | 0.326 | 0.004 |
| 9 | Example 2 | 0.326 | 0.004 |
| 10 | Example 1 | 0.314 | 0.016 |
| 11 | Example 2 | 0.314 | 0.016 |
| 12 | Example 1 | 0.287 | 0.033 |
| 13 | Example 2 | 0.287 | 0.033 |
| 14 | Example 3 | 0.287 | 0.033 |
| 15 | Example 4 | 0.287 | 0.033 |
| 16 | Example 5 | 0.287 | 0.033 |
| 17 | Example 6 | 0.287 | 0.033 |
| 18* | Example 7 | 0.326 | 0.004 |

*denotes a comparative example

Example 19: Film Strip Testing

The compositions were spin-coated onto 200 mm silicon wafers and baked at 205° C. for 60 seconds by MARK track (Step 1). The coated wafer was exposed to 30 mL of PGMEA:PGME (30:70 wt % ratio) for 90 seconds, spun-dry to form thin film, and cured at 110° C. for 60 seconds (Step 2). The film thickness was measured at initial coated film (Step 1) and post baked film (Step 2) by Opti-probe. The amount of stripping was determined to be the difference between the Step 1 and Step 2 thicknesses.

Example 20: Lithographic Testing

Silicon wafers were coated on a TEL Lithius 300 mm wafer track with AR™ 40 organic bottom anti-reflective coating and cured at 205° C. for 60 seconds to form a 700 Å first BARC layer. The compositions of Examples 8 to 18 were then coated over the first BARC layer and cured at 205° C. for 60 seconds to form a 390 Å second layer. EPIC™ IM7011 (Meth)acrylate-based ArF Photoresist (DuPont Electronics & Imaging) was coated over the second layer and soft-baked at 110° C. for 60 seconds to form a 900 Å thickness layer. The wafers were exposed on a NIKON 610C ArF immersion scanner at 1.3 NA, 0.98/0.78 inner/outer sigma, dipole illumination, through a photomask to form 40/80 nm line/space pattern. The wafers were post-exposure baked (PEB) at 95° C. for 60 seconds. The wafers were developed with 0.26 N TMAH developer and spun-dry to form positive tone patterns. The patterned wafers were inspected using a CD-SEM tool.

The results for Examples 19 and 20 are provided in Table 2.

TABLE 2

| Sample | Film strip loss (Å) | EoP (mJ/cm$^2$) | Pattern Collapse CD (nm) |
|---|---|---|---|
| Example 8 | −1.2 | 36.4 | 39.0 |
| Example 9 | −0.8 | 35.6 | 40.2 |
| Example 10 | −1.1 | 36.7 | 39.3 |
| Example 11 | −1.0 | 35.7 | 39.2 |
| Example 12 | −1.2 | 36.0 | 40.4 |
| Example 13 | −0.7 | 36.2 | 39.3 |
| Example 14 | −0.8 | 38.0 | 42.2 |
| Example 15 | −1.0 | 36.0 | 41.0 |
| Example 16 | −0.9 | 37.8 | 42.0 |
| Example 17 | −0.5 | 37.4 | 41.2 |
| Example 18* | −1.6 | 37.6 | 38.9 |

*denotes comparative example

As shown in Table 2, the underlayer coating compositions of Examples 8 to 17 achieved a pattern collapse improvement with reduction of film strip loss relative to Example 18 (comparative).

While this disclosure has been described in connection with what is presently considered to be practical exemplary aspects, it is to be understood that the invention is not limited to the disclosed aspects, but, on the contrary, is intended to cover various modifications and equivalent arrangements included within the spirit and scope of the appended claims.

What is claimed is:

1. A coated substrate, comprising:
a layer of an underlayer coating composition disposed on a substrate; and
a photoresist layer disposed on the layer of the underlayer coating composition,
wherein the underlayer coating composition comprises a polymer comprising:
a first repeating unit comprising an amino group protected by an alkoxycarbonyl group;
a second repeating unit comprising a nucleophilic group; and
a third repeating unit comprising a crosslinkable group,
wherein the first repeating unit, the second repeating unit, and the third repeating unit are different from each other.

2. The coated substrate of claim 1, wherein the first repeating unit is derived from a monomer of formula (1):

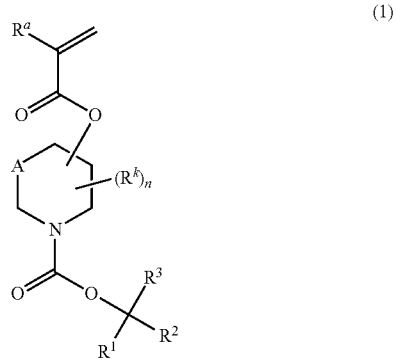

(1)

wherein,
$R^a$ is hydrogen, fluorine, a substituted or unsubstituted $C_{1-5}$ alkyl, or a substituted or unsubstituted $C_{1-5}$ fluoroalkyl;
each $R^k$ is independently a halogen, a hydroxy, a carboxylic acid or ester, a thiol, a straight chain or branched $C_{1-20}$ alkyl, a monocyclic or polycyclic $C_{3-20}$ cycloalkyl, a monocyclic or polycyclic $C_{3-20}$ fluorocycloalkenyl, a monocyclic or polycyclic $C_{3-20}$ heterocycloalkyl, a monocyclic or polycyclic $C_{6-20}$ aryl, or a monocyclic or polycyclic $C_{4-20}$ heteroaryl, each of which is substituted or unsubstituted;
A is a single bond or a $C_{1-2}$ alkylene;
$R^1$, $R^2$, and $R^3$ are each independently a straight chain or branched $C_{1-20}$ alkyl, a monocyclic or polycyclic $C_{3-20}$ cycloalkyl, a monocyclic or polycyclic $C_{3-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted, and any two of $R^1$, $R^2$, and $R^3$ together optionally form a ring; and
n is an integer of 0 to 11.

3. The coated substrate of claim 1, wherein the first repeating unit is derived from a monomer of formula (2):

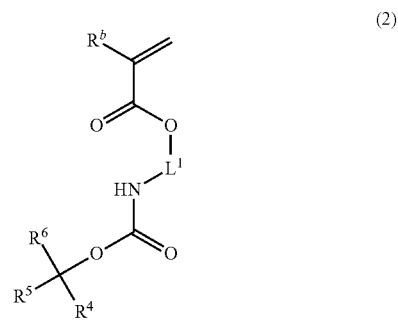

(2)

wherein,
$R^b$ is hydrogen, fluorine, a substituted or unsubstituted $C_{1-5}$ alkyl, or a substituted or unsubstituted $C_{1-5}$ fluoroalkyl;
$L^1$ is a linking group; and
$R^4$, $R^5$, and $R^6$ are each independently a straight chain or branched $C_{1-20}$ alkyl, a monocyclic or polycyclic $C_{3-20}$ cycloalkyl, a monocyclic or polycyclic $C_{3-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted, and any two of $R^4$, $R^5$, and $R^6$ together optionally form a ring.

4. The coated substrate of claim 1, wherein the second repeating unit is derived from a monomer of formula (3):

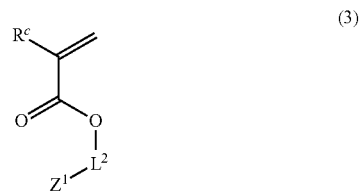

(3)

wherein
$R^c$ is hydrogen, fluorine, a substituted or unsubstituted $C_{1-5}$ alkyl, or a substituted or unsubstituted $C_{1-5}$ fluoroalkyl;
$L^2$ is a substituted or unsubstituted $C_{1-30}$ alkylene, a substituted or unsubstituted $C_{3-30}$ cycloalkylene, a substituted or unsubstituted $C_{3-30}$ heterocycloalkylene, a substituted or unsubstituted $C_{6-30}$ arylene, a substituted or unsubstituted divalent $C_{7-30}$ arylalkyl, a substituted or unsubstituted $C_{3-30}$ heteroarylene, or a substituted or unsubstituted divalent $C_{4-30}$ heteroarylalkyl; and
$Z^1$ is hydroxyl, carboxyl, thiol, amino, or amido.

5. The coated substrate of claim 1, wherein the third repeating unit is derived from a monomer of formula (4):

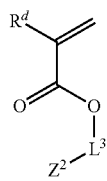

(4)

wherein,
  $R^d$ is hydrogen, fluorine, a substituted or unsubstituted $C_{1-5}$ alkyl, or a substituted or unsubstituted $C_{1-5}$ fluoroalkyl;
  $L^3$ is a single bond, a substituted or unsubstituted $C_{1-30}$ alkylene, a substituted or unsubstituted $C_{3-30}$ cycloalkylene, a substituted or unsubstituted $C_{3-30}$ heterocycloalkylene, a substituted or unsubstituted $C_{6-30}$ arylene, a substituted or unsubstituted divalent $C_{7-30}$ arylalkyl, a substituted or unsubstituted $C_{3-30}$ heteroarylene, or a substituted or unsubstituted divalent $C_{4-30}$ heteroarylalkyl; and
  $Z^2$ is epoxy or lactone.

6. The coated substrate of claim 1, wherein the polymer comprises:
  5 to 60 mole percent of the first repeating unit;
  20 to 65 mole percent of the second repeating unit; and
  20 to 65 mole percent of the third repeating unit,
  each based on 100 mole percent of total repeating units in the polymer.

7. The coated substrate of claim 1, wherein the underlayer coating composition further comprises:
  an acid catalyst; and
  a solvent.

8. The coated substrate of claim 1, wherein the underlayer coating composition further comprises an additional polymer that is different from the polymer.

9. A patterning method, comprising:
  applying a layer of an underlayer coating composition on a substrate;
  baking the underlayer coating composition to form an underlayer film;
  applying a layer of a photoresist composition on the underlayer film to form a photoresist layer;
  pattern-wise exposing the photoresist layer to activating radiation; and
  developing the exposed photoresist layer to provide a resist relief image,
  wherein the underlayer coating composition comprises a polymer comprising:
  a first repeating unit comprising an amino group protected by an alkoxycarbonyl group;
  a second repeating unit comprising a nucleophilic group; and
  a third repeating unit comprising a crosslinkable group,
  wherein the first repeating unit, the second repeating unit, and the third repeating unit are different from each other.

10. The method of claim 9, wherein the first repeating unit is derived from a monomer of formula (1):

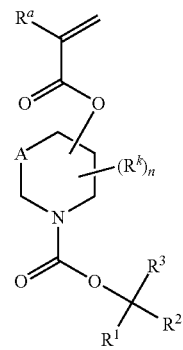

(1)

wherein,
  $R^a$ is hydrogen, fluorine, a substituted or unsubstituted $C_{1-5}$ alkyl, or a substituted or unsubstituted $C_{1-5}$ fluoroalkyl;
  each $R^k$ is independently a halogen, a hydroxy, a carboxylic acid or ester, a thiol, a straight chain or branched $C_{1-20}$ alkyl, a monocyclic or polycyclic $C_{3-20}$ cycloalkyl, a monocyclic or polycyclic $C_{3-20}$ fluorocycloalkenyl, a monocyclic or polycyclic $C_{3-20}$ heterocycloalkyl, a monocyclic or polycyclic $C_{6-20}$ aryl, or a monocyclic or polycyclic $C_{4-20}$ heteroaryl, each of which is substituted or unsubstituted;
  A is a single bond or a $C_{1-2}$ alkylene;
  $R^1$, $R^2$, and $R^3$ are each independently a straight chain or branched $C_{1-20}$ alkyl, a monocyclic or polycyclic $C_{3-20}$ cycloalkyl, a monocyclic or polycyclic $C_{3-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted, and any two of $R^1$, $R^2$, and $R^3$ together optionally form a ring; and
  n is an integer of 0 to 11.

11. The method of claim 9, wherein the first repeating unit is derived from a monomer of formula (2):

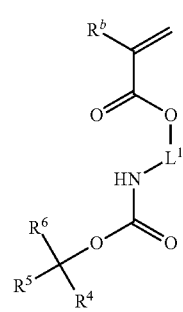

(2)

wherein,
  $R^b$ is hydrogen, fluorine, a substituted or unsubstituted $C^{1-5}$ alkyl, or a substituted or unsubstituted $C_{1-5}$ fluoroalkyl;
  $L^1$ is a linking group; and
  $R^4$, $R^5$, and $R^6$ are each independently a straight chain or branched $C_{1-20}$ alkyl, a monocyclic or polycyclic $C_{3-20}$ cycloalkyl, a monocyclic or polycyclic $C_{3-20}$ heterocycloalkyl, a straight chain or branched C2-20 alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted, and any two of $R^4$, $R^5$, and $R^6$ together optionally form a ring.

12. The method of claim 9, wherein the second repeating unit is derived from a monomer of formula (3):

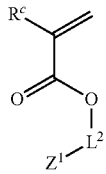

(3)

wherein
$R^c$ is hydrogen, fluorine, a substituted or unsubstituted $C_{1-5}$ alkyl, or a substituted or unsubstituted $C_{1-5}$ fluoroalkyl;
$L^2$ is a substituted or unsubstituted $C_{1-30}$ alkylene, a substituted or unsubstituted $C_{3-30}$ cycloalkylene, a substituted or unsubstituted $C_{3-30}$ heterocycloalkylene, a substituted or unsubstituted $C_{6-30}$ arylene, a substituted or unsubstituted divalent $C_{7-30}$ arylalkyl, a substituted or unsubstituted $C_{3-30}$ heteroarylene, or a substituted or unsubstituted divalent $C_{4-30}$ heteroarylalkyl; and
$Z^1$ is hydroxyl, carboxyl, thiol, amino, or amido.

13. The method of claim 9, wherein the third repeating unit is derived from a monomer of formula (4):

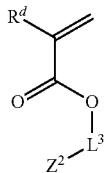

(4)

wherein,
$R^d$ is hydrogen, fluorine, a substituted or unsubstituted $C_{1-5}$ alkyl, or a substituted or unsubstituted $C_{1-5}$ fluoroalkyl;
$L^3$ is a single bond, a substituted or unsubstituted $C_{6-30}$ alkylene, a substituted or unsubstituted $C_{3-30}$ cycloalkylene, a substituted or unsubstituted $C_{3-30}$ heterocycloalkylene, a substituted or unsubstituted $C_{6-30}$ arylene, a substituted or unsubstituted divalent $C_{7-30}$ arylalkyl, a substituted or unsubstituted $C_{3-30}$ heteroarylene, or a substituted or unsubstituted divalent $C_{4-30}$ heteroarylalkyl; and
$Z^2$ is epoxy or lactone.

14. The method of claim 9, wherein the polymer comprises:

5 to 60 mole percent of the first repeating unit;

20 to 65 mole percent of the second repeating unit; and 20 to 65 mole percent of the third repeating unit, each based on 100 mole percent of total repeating units in the polymer.

15. The method of claim 9, wherein the underlayer coating composition further comprises:

an acid catalyst; and a solvent.

16. The method of claim 9, wherein the underlayer coating composition further comprises an additional polymer that is different from the polymer.

17. The method of claim 9, wherein the activating radiation comprises a wavelength of 193 nanometers.

18. The method of claim 9, wherein the activating radiation comprises an EUV wavelength.

* * * * *